Figure 1:
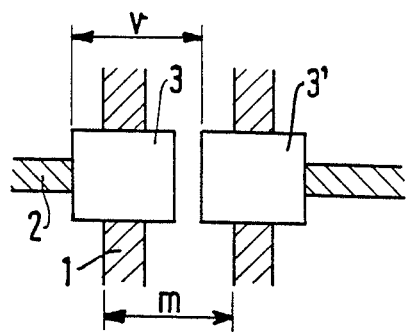

United States Patent [19]

Rabinzohn

[11] Patent Number: 4,803,177
[45] Date of Patent: Feb. 7, 1989

[54] METHOD OF FORMING INTERCONNECTIONS AND CROSSINGS BETWEEN METALLIZATION LEVELS OF AN INTEGRATED CIRCUIT

[75] Inventor: Patrick Rabinzohn, Saint Maurice, France

[73] Assignee: U.S. Philips Corporation, New York, N.Y.

[21] Appl. No.: 135,879

[22] Filed: Dec. 21, 1987

[30] Foreign Application Priority Data

Dec. 23, 1986 [FR] France ................... 86 18048

[51] Int. Cl.⁴ ........................................... H01L 21/28
[52] U.S. Cl. ..................................... 437/51; 437/189;
437/195; 437/228
[58] Field of Search ................. 437/51, 189, 192, 193,
437/194, 195, 228; 357/40, 71

[56] References Cited

U.S. PATENT DOCUMENTS

| | | | |
|---|---|---|---|
| 4,378,383 | 3/1983 | Moritz | 437/203 |
| 4,505,030 | 3/1985 | Jeuch | 437/228 |
| 4,518,629 | 5/1985 | Jeuch | 437/228 |
| 4,541,893 | 8/1985 | Knight | 437/192 |
| 4,545,852 | 10/1985 | Barton | 437/228 |
| 4,689,113 | 8/1987 | Balasubramanyam et al. | 437/228 |

FOREIGN PATENT DOCUMENTS

| | | | |
|---|---|---|---|
| 0170551 | 10/1982 | Japan | 437/194 |
| 0142546 | 8/1983 | Japan | 437/184 |
| 0181017 | 10/1984 | Japan | 437/194 |
| 0164242 | 7/1986 | Japan | 437/194 |
| 0237450 | 10/1986 | Japan | 437/194 |

Primary Examiner—Brian E. Hearn
Assistant Examiner—Tom Thomas
Attorney, Agent, or Firm—Paul R. Miller

[57] ABSTRACT

A method, in which the formation of a first metallization level (a) is followed by the deposition of a first and a second isolating layer (b and c), by a selective etching step of the second isolating layer with respect to the first layer (d), the planarization of the structure thus obtained by a sacrificial layer and by the etching of this sacrificial layer down to the level of the second isolating layer (f), the selective etching step between these different layers so as to merge at the first metallization level with respect to a metallization and to ensure simultaneously the isolation between metallization levels with respect to a crossing (g) and finally the formation of the second metallization level (h). This method of quasi self-alignment eliminates a photo-lithographic step and ensures a substantial increase in integration density and in reliability of the circuit.

8 Claims, 2 Drawing Sheets a₁ a₂ b₁ b₂

METHOD OF FORMING INTERCONNECTIONS AND CROSSINGS BETWEEN METALLIZATION LEVELS OF AN INTEGRATED CIRCUIT

The invention relates to a method of forming interconnections and crossings between metallization levels of an integrated circuit, in which a first metallization level having a thickness $e_{m1}$ has been formed on a substrate during an initial sequence by means of etching or "lift-off" techniques generally used.

Such an integrated circuit comprises an assembly of elements connected to each other through metallization patterns. These elements occupy an important part of the surface of the circuit. Thus, the increase of the integration density is obtained by the use of several metallization levels (typically two to three) separated by layers of isolating material and connected to each other according to a precise pattern.

The whole of the technological operations required to form such multilayers (conductors/isolators) has to permit a high manufacturing efficiency and a high integration density. The latter causes two significant parameters to occur: the pitch of the metallization levels and the volume of the interconnection between two levels. The former is fixed by the technique of defining the metallization level (etching or "lift-off"). The latter depends upon the interconnection technique and proves to be limitative according to the prior art.

Two important interconnection techniques are used nowadays: the technique using holes and the technique using pillars.

The interconnection method according to the technique using holes involves three photolithographic steps during the stages of the technological sequence: the first stage for defining the first metallization level, the second stage for etching the interconnection holes and the third stage for defining the second metallization level.

The limitations imposed by this technique are the following:

the profile of the hole etched into the dielectric must have a controlled slope in order to avoid the problems of covering the steps (thinning or discontinuity of the second level). An adapted method of the technique using "spacers" can be used to obtain gradual profiles. The resolution of the step of etching holes is improved by the use of reactive ion etching (anisotropic method) and the use of specific techniques for controlling the profile;

the volume of the interconnection (level of masks enclosed in order to avoid metallization and alignment errors) takes into account the slope of the etching method and the positioning tolerances.

The currently used dielectric is silica. The same considerations apply to other types of isolators.

In the technique using interconnection pillars, a metal pillar is formed at the area of an interconnection between the two metallization levels.

The method of forming according to this technique requires also the use of photolithographic steps, the first during the definition of the first metallization level in the form of a multilayer structure (conductor-metal blocking etching layer-conductor), the second during the definition of the metal pillar by means of an etching step down to the blocking layer and the third during the definition of the second metallization level after the deposition of the isolating dielectric between levels and planarization of said dielectric by the use of a sacrificial layer so as to merge onto said pillars.

In a variation of this method constituting the most relevant prior art (U.S. Pat. No. 4,541,169), the definition of the first metallization level is effected by means of a simple metal layer and the definition of the pillars is obtained by "lift-off".

The technique of the pillars defined by etching permits of reducing the volume of the interconnection: only the positioning tolerances subsist. It has the advantage of leading to a flat composite structure metal-isolator and further permits a partial self-alignment of the pillar in one direction at the first level, but the necessity of using the chlorinated plasma for etching the metal is a recognized risk of contamination and corrosion.

The invention has for its object to reduce still further the volume of the interconnection in order to obtain a better integration density. In the suggested method, not a single specific photolithographic step is necessary to form the interconnections between metallization levels. The quasi self-alignment of the interconnections constitutes the fundamental difference with respect to the currently used techniques (etching of holes at the level of the interconnections, "lift-off" or etching of metal pillars) for the formation of integrated circuits at several metallization levels.

The method according to the invention is characterized in that after the said initial sequence a resulting in that the said first metallization level is obtained, the inversion of a relief at the level of an interconnection is obtained by isotropic deposition, planarization by means of a sacrificial layer and anisotropic selective etching with respect to the said sacrificial layer according to the following further steps:

b. deposition of a first isolating layer having a thickness $e_{i1}$ constituting the isolation between the said metallization level and the metallization level immediately above it, c. deposition of a second isolating layer having a thickness $e_{i2}$ constituting a phantom mask, which will permit of ensuring the isolation by the said first layer at the levels of the crossings of the metallizations, d. etching of the isolation pattern of the said second isolating layer selectively with respect to the first layer, e. planarization of the structure thus obtained by the use of a sacrificial layer according to this prior art, f. etching of the said sacrificial layer down to the level of the second isolation layer, g. etching of the structure thus obtained so that the respective etching rates $R_1$, $R_2$ and $R_S$ of the said first, second and sacrificial layers, respectively, permit of merging at the first level of metallization, while at the same time the said second isolating layer having a thickness $e_{i2}$ is partly or entirely etched on the surface of the said structure, the relief of the said first metallization level and the inversion of a relief at the areas of the interconnections resulting from a selective etching of the first isolating layer with respect to the sacrificial layer, which ensures the self-alignment of the etching of the said first isolating layer at the first metallization level without any specific photolithographic step, h. formation of the said metallization level lying immediately above it by means of a conventional technique.

If the said first metallization level comprises elements having different thicknesses, for example $e_{m1}$ and $e'_{m1}$ ($e'_{m1} < e_{m1}$), to be interconnected simultaneously at the second metallization level, the said sequence comprises after the step g the following supplementary steps, the step h remaining unchanged:

g' deposition of a third isolating layer on the relief structure obtained at the end of the step g, for which the metallization level having a thickness $e_{m1}$ is reached, g" etching of the isolation pattern of the said third layer selectively with respect to the first layer, g''' etching of the structure thus obtained so that the respective etching rates $R_1$ and $R_3$ of the said first and third isolating layers permit of merging at the metallization elements of smaller thickness $e'_{m1}$, while at the same time the thickness of the third isolating layer is entirely etched on the flat surfaces of the said structure and partly etched with a thickness increasing from top to bottom on the walls of the holes above the metal elements of larger thickness $e_{m1}$ (so-called technique "using spacers").

The first isolating layer may be a single layer (for example of silica) or a multilayer (of silicon nitride/silica). The deposition of this layer and of the other successive layers is isotropic and formed inter alia by chemical action from the vapour phase (CVD or PECVD).

The selective etching of an isolating layer with respect to another such layer can be obtained by means of ion etching (RIE fluorine-oxygen). The sacrificial layer is constituted by a resin or a polyimide.

The etching conditions are given by relations between the various metal and isolation thickness on the one hand and the corresponding etching rates in the various dielectric isolating materials on the other hand.

The choice of a sufficient thickness $e_{i2}$ permits of maintaining a double layer of isolating dielectric materials, which improves the reliability and the efficiency of the integrated circuit.

Figure 2:
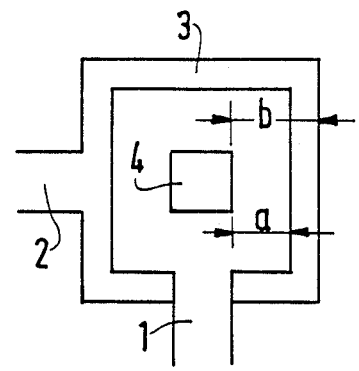
Figure 4:
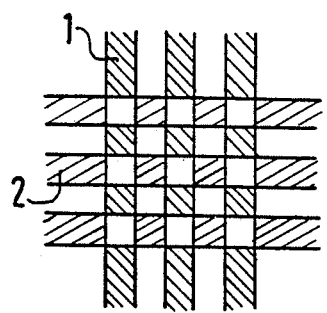
Figure 4:
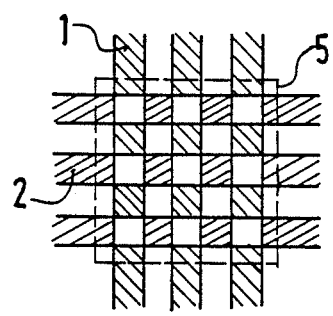
Figure 4:
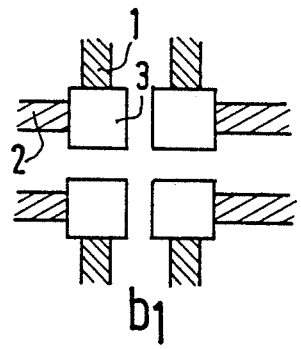
Figure 4:
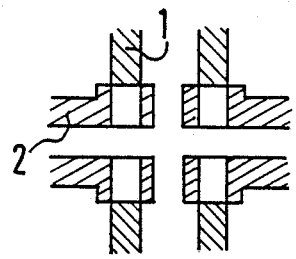
Figure 3:
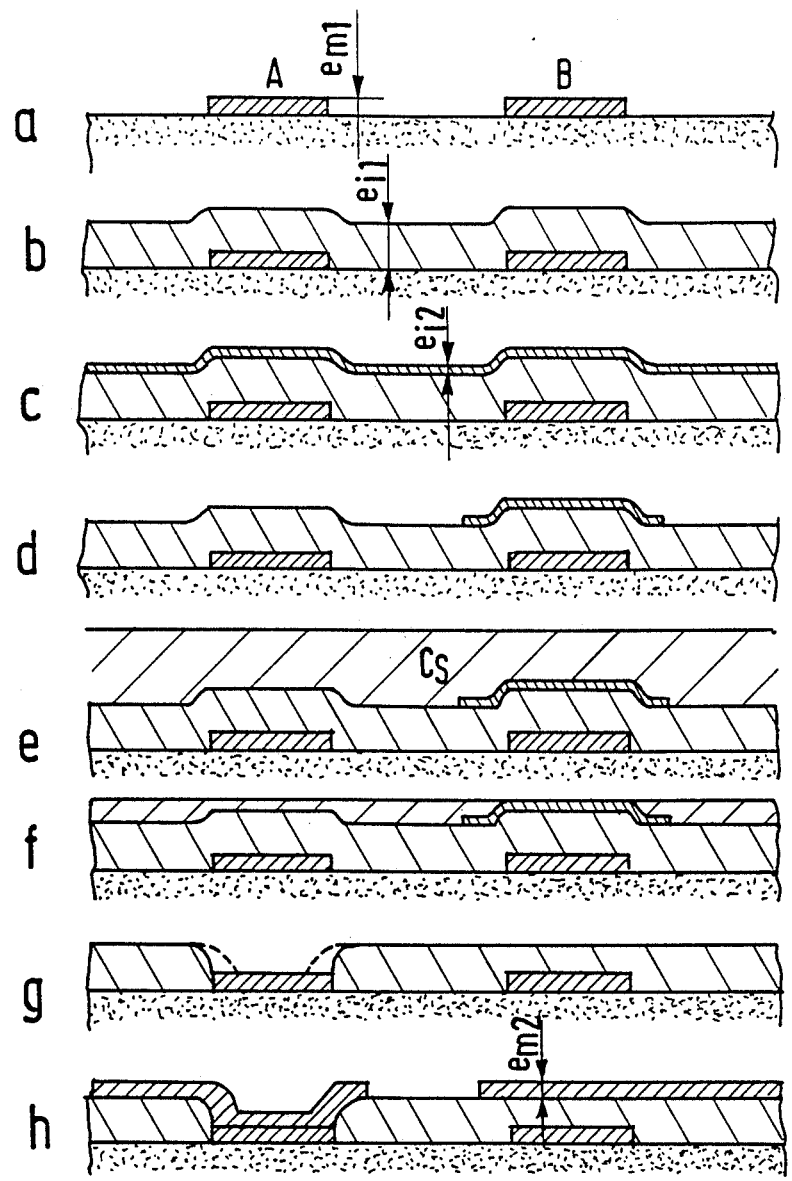

In order that the invention may be readily carried out, it will now be described more fully, by way of example, with reference to the accompanying drawings, in which:

FIG. 1 defines the volume sizes relative to the metallizations and interconnections, FIG. 2 defines the parameters associated with the volume of an interconnection, FIG. 3 shows diagrammatically the technological sequence of the formation of an interconnection and of a crossing between two metallization levels of an integrated circuit according to the method in accordance with the invention, FIG. 4 shows on a few metallization patterns the comparison of the integration capacities according to the prior art and according to the method of the invention for interconnections and crossings between two metallization levels.

The reference symbols corresponding to the same elements are identical in the various Figures.

FIG. 1 shows in plan view beside each other two interconnection patterns 3—3' between the upper and lower metallization levels 2 and 1, respectively.

The pitch of the metallization levels is the distance m between corresponding edges from one metal strip to the other.

The volume of the interconnection is defined in the same manner by the distance v between two corresponding edges from one pattern to the other.

FIG. 2 shows, for example, on an enlarged scale the interconnection pattern 3 shown in FIG. 1. The volume of this pattern defined by the levels of masks enclosed in order to avoid the metallization and alignment errors takes into account the sloping of the etching method B and the positioning tolerance P. In FIG. 2, a and b are the respective distances from one edge of the interconnection hole 4 to the edges of the said masks.

In the technique using holes, there are the relations $a = P$ and $b = B + P$.

In the technique using pillars defined by etching, which permits a smaller volume than the preceding technique, there is the relation $a = b = P$.

The technological sequence of the method according to the invention is shown diagrammatically in FIG. 3.

During a preliminary step indicated diagrammatically at a, a first metallization level has been obtained on a substrate S by means of a known technique (etching or "lift-off"). Two contiguous strips of this metallization A and B having a thickness $e_{m1}$ are shown in cross-section taken on the plane of the Figure. There is suggested to form between this first metallization level and the level immediately above it an interconnection on the strip A and a crossing above the strip B in accordance with the method of the invention, by following the order of the steps (shown diagrammatically) from b to h. Step b: deposition of a first single isolating layer (silica) or a double layer (silicon nitride/silica) having a thickness $e_{i1}$. This first layer will constitute the isolation between metallizations.

Step c: deposition of a second isolating layer of smaller thickness $e_{i2}$, which will permit of ensuring the isolation by the first layer at the crossing level. The depositions thus formed are isotropic and are obtained by chemical action from the vapour phase (CVD or PECVD).

Step d: lithographic definition of an isolation pattern and selective etching according to this pattern of the second layer with respect to the first layer, Step e: planarization of the structure thus obtained by the use of a sacrificial layer $C_S$ of resin or polyimide.

Step f: etching of this sacrificial layer as to merge on the second isolating layer.

Step g: etching of the structure thus obtained so that the respective etching rates $R_1$, $R_2$, $R_S$ of the isolating layers having thicknesses $e_{i1}$ and $e_{i2}$ and of the sacrificial layer permit of merging on the metal strip A, while at the same time the isolating layer having a thickness $e_{i2}$ is partly or entirely etched on the flat surface above the metal strip B.

The above etching steps are effected, for example, by means of an ion method (RIE fluorine-oxygen).

The etching conditions are given, for example, by the following relations between the etching rates and the thicknesses of the dielectrics:

$$\text{at the interconnection level: } \frac{R_1}{R_S} \geq \frac{e_{i1}}{e_{m1}}$$

$$\text{at the crossing level: } \frac{R_1}{R_2} - \frac{R_1}{R_S} \geq \frac{e_{i1} - e_{m1}}{e_{i2}}.$$

Step h: formation by a conventional technique of the metallization level immediately above it, having a thickness $e_{m2}$ so as to form the interconnection and the crossing specifically between the two levels.

The self-aligned character of the etching of the first isolation layer at the first metallization level originates from the relief of the latter and from the inversion of the said relief by selective etching. The photolithographic step is thus eliminated.

The replacement of the definition of the interconnection points (holes or pillars) by the definition of isolated zones permits a substantial increase in integration density. These zones can in fact be re-arranged and the resulting pattern, which is much less critical, does not impose any limitations on the design.

FIG. 4 permits of comparing the integration capacities according to the prior art (at $a_1$ and $b_1$) and according to the quasi self-aligned technique of the invention (at $a_2$ and $b_2$) for crossings (at $a_1$ and $a_2$) and interconnections (at $b_1$ and $b_2$) between two levels 1 and 2 shown in plan view. On the diagram $a_2$ of the Figure, the "phantom" isolation mask 5 is indicated by dotted lines.

The pitch of the metallization levels m remains that of the prior art, i.e. m=2 μm, which is a spacing of 1 μm between metal strips.

The volume of the interconnection v is 3 μm, i.e., for example, a hole of 1 μm, a tolerance of 0.5 μm and a spacing of 1 μm.

It appears from the comparison of the diagrams $b_1$ and $b_2$ of FIG. 4 that the interconnection pattern formed according to the method of the invention permits a gain of 20% on the surface occupied by the pattern according to the prior art. This reduction of the volume depends upon the pattern and upon the rules of design available. It is especially the more important as the alignment tolerances are larger. The preceding number therefore is a minimum, taking into account the choice of rules at the limit of the actual possibilities for the example chosen.

The interconnection technique according to the invention therefore permits of increasing the integration density. Otherwise, the dielectric comprising a double layer obtained when the thickness of the second layer $e_{i2}$ is sufficient leads to an improvement of the efficiency and of the reliability.

When the thicknesses of the metallizations of the first level are different, the use of the technique utilizing "spaces" (deposition of a dielectric on the relief obtained at the end of the technological step g followed by the step of etching this dielectric) leads to the structure indicated by dotted lines on the diagram g of FIG. 3. Two substantial advantages ensue therefrom: a better control of the passage of steps and the possibility of merging simultaneously on patterns of the first metallization level situated at different heights. The "spacer" can be chosen such that it is just etched during the over-etching, which permits of merging on the pattern of lowest height.

What is claimed is:

1. A method of forming interconnections and crossings between metallization levels of an integrated circuit, in which a first metallization level having a thickness $e_{m1}$ has been formed on a substrate during an initial sequence a by means of etching or "lift-off" techniques generally used, characterized in that after the said initial sequence a resulting in that the said first metallization level is obtained, the inversion of a relief at the level of an interconnection is obtained by isotropic deposition, planarization by means of a sacrificial layer and anisotropic selective etching with respect to the said sacrificial layer according to the following further steps:
   b. deposition of a first isolating layer having a thickness $e_{i1}$ constituting the isolation between the said metallization level and the metallization level immediately above it,
   c. deposition of a second isolating layer having a thickness $e_{i2}$ constituting a phantom mask which will permit of ensuring the isolation by the said first layer at the levels of the crossings of the metallizations,
   d. etching of the isolation pattern of the said second isolating layer selectively with respect to the first layer,
   e. planarization of the structure thus obtained by the use of a sacrificial layer,
   f. etching of the said sacrificial layer down to the level of the second isolating layer,
   g. etching of the structure thus obtained so that the respective etching rates $R_1$, $R_2$ and $R_S$ of the said first, second and sacrificial layers, respectively, permit of merging at the first level of metallization, while at the same time the said second isolating layer having a thickness $e_{i2}$ is partly or entirely etched on the surface of the said structure, the relief of the said first metallization level and the inversion of a relief at the areas of the interconnections resulting from a selective etching of the first isolating layer with respect to the sacrificial layer, which ensures the self-alignment of the etching of the said first isolating layer at the first metallization level without any specific photolithographic step,
   h. formation of the said metallization level lying immediately above it.

2. A method as claimed in claim 1, in which the said first metallization level comprises elements of different thicknesses, for example $e_{m1}$ and $e'_{m1}$, ($e'_{m1} < e_{m1}$), characterized in that it comprises after the technological step g the following supplementary steps, the step h remaining unchanged:
   g′ deposition of a third isolating layer on the relief structure obtained at the end of the step g, for which the metallization level having a thickness $e_{m1}$ is reached,
   g″ etching according to an isolation pattern of the said third layer selectively with respect to the first layer,
   g‴ etching of the structure thus obtained so that the respective etching rates $R_1$ and $R_3$ of the said first and third isolating layers, respectively, permit of merging on the metallization elements of smaller thickness $e'_{m1}$, while at the same time the thickness of the third isolating layer is entirely etched on the flat surface of the said structure and is partly etched with a thickness increasing from top to bottom on the walls of the holes above the metal elements of larger thickness $e_{m1}$.

3. A method as claimed in any one of claims 1 or 2, characterized in that the said first isolating layer may be a single layer or a double layer.

4. A method as claimed in any one of claims 1 or 2, characterized in that the said depositions of isolating layers are isotropic.

5. A method as claimed in any one of claims 1 or 2, characterized in that the selective etching of an isolating layer with respect to another such layer is obtained.

6. A method as claimed in any one of claims 1 or 2, characterized in that the said sacrificial layer is constituted, by a resin or a polyimide.

7. A method as claimed in any one of claims 1 or 2, characterized in that the etching conditions are given by relations between the various metal and isolation thicknesses on the one hand and the corresponding etching rates in the various dielectric isolation materials on the other hand.

8. A method as claimed in any one of claims 1 or 2, characterized in that the choice of a sufficient thickness $e_{i2}$ permits maintaining a double layer of isolation dielectric materials, which improves the reliability and the efficiency of the integrated circuit.

* * * * *